United States Patent [19]
Ou et al.

[11] Patent Number: 5,978,954
[45] Date of Patent: Nov. 2, 1999

[54] ON-THE-FLY ERROR DETECTION AND CORRECTION BUFFER PROCESSOR

[75] Inventors: Michael Ou, Newark; Lyle E. Adams, San Jose; S. Jauher A. Zaidi, San Jose; Hussam I. Ramlaoui, San Jose, all of Calif.

[73] Assignee: Palmchip Corporation, San Jose, Calif.

[21] Appl. No.: 08/976,442

[22] Filed: Nov. 25, 1997

[51] Int. Cl.$^6$ .............................. H03M 13/00; G11B 20/18
[52] U.S. Cl. .............................................. 714/769; 714/784
[58] Field of Search ........................................ 714/769, 784

[56] References Cited

U.S. PATENT DOCUMENTS

| | | | |
|---|---|---|---|
| 4,888,778 | 12/1989 | Brechard et al. | 371/37.4 |
| 5,742,534 | 4/1998 | Monier | 364/746.1 |
| 5,771,244 | 6/1998 | Reed et al. | 371/37.01 |
| 5,812,564 | 9/1998 | Bonke et al. | 371/40.1 |
| 5,864,568 | 1/1999 | Nemazie | 371/40.14 |
| 5,889,792 | 3/1999 | Zhang et al. | 371/37.11 |

*Primary Examiner*—Stephen M. Baker
*Attorney, Agent, or Firm*—Thomas E. Schatzel; Law Offices of Thomas E. Schatzel, A Prof. Corp.

[57] ABSTRACT

An on-the-fly error detection and correction hardware core for a mass storage hard disk drive comprises a microcode machine optimized and limited to doing Galois Field arithmetic ($GF[2_8]$) in support of Reed-Solomon error detection and correction (RS-EDC). The microcode machine is implemented as a hardware core in a system-on-a-chip design that includes a general purpose core RISC-processor. A dual-input arithmetic logic unit (ALU) includes a set of basic arithmetic blocks necessary to support the RS-EDC operations, i.e., a multiplier, a dedicated adder, a general purpose adder, a divider, a log unit, a quadratic solution lookup, a cubic solution lookup, and a move datapath. The operations and outputs of all the basic arithmetic blocks are presented in parallel to an op-code selector. The selected output is routed back for deposit to one of eight general purpose registers (R0–R7). A set of up to eight syndrome registers (S0–S7) can be selectively routed along with R0–R7 through a pair of ALU-input selectors. A microinstruction register allows a destination register decoder to be controlled, instruction-by-instruction, as well as the ALU input and output selectors. The microcode program is stored in a ROM-type structure that is indexed by a program counter. A flow control selector allows either the next microprogram address (+1) to be selected from an incrementer, or a branch address to be selected from a jump table.

5 Claims, 4 Drawing Sheets

ON-THE-FLY ERROR DETECTION AND CORRECTION BUFFER PROCESSOR

BACKGROUND OF THE INVENTION

1. Field of the Invention

The invention relates generally to computer data storage and communication error detection and correction methods and devices, and more specifically to dedicated microcode processors that are optimized for on-the-fly Galois field Reed-Solomon error correction code operations in hard disk drives.

2. Description of the Prior Art

The recording and readback of every bit in a sector on a hard disk drive cannot be perfect, given practical error rates. So various error detecting and correcting schemes are employed to transparently bridge over the data errors that will occur when accessing the physical medium. This basically involves an overhead that is written into each sector that will help in the detecting and correcting of errors in the data fields during playback. The best such schemes do not impose an access delay that can slow down disk operations, nor do they load a computational overhead on the host processor. In other words, the ideal schemes are transparent to the host in terms of data latency and management overhead.

Reed-Solomon (RS) error correction codes are widely used in modern digital electronics systems such as compact disk players and satellite communication links. Reed-Solomon codes rely on doing arithmetic in finite, or Galois, fields. A particular field, $GF(2^8)$, is of central importance for many practical systems. The most elementary operations in Reed-Solomon decoders are multiplication and inversion. As a result, the time such Galois field operations take to execute and the resources dedicated to their operation are very critical.

Finite fields have many applications in error control coding. Error control coding is, in turn, very important in many communications applications to maintain the integrity of data being transmitted between remote locations. Finite fields are also used in digital signal processing, psuedorandom number generation, and the encryption and decryption protocols basic to cryptography.

For error control coding, the most common decoding procedure for a "t-error" correcting Reed-Solomon code consists of calculating the syndrome values, determining the error locator polynomial using algorithms such as Berlekamp's iterative algorithm or the Modified Euclid's algorithm, solving for the roots of the error locator polynomial, and computing the error magnitudes using methods such as Forney's algorithm.

The most computationally intensive step is determining the error locator polynomial because it involves extensive multiplication and inversion as "t" increases. Addition is a relatively simple operation, however multiplication, inversion, and exponentiation are more complex operations. Therefore as the demand for faster data transfers with error detection and correction increases, the design of efficient, high performance circuits to perform finite field arithmetic operations is gaining more attention.

Efficient architectures for error detection and decoding of Reed-Solomon encoded data can do their arithmetic operations in the Galois field. C. Y. Wang at the University of Minnesota (cywang@ee.umn.edu) reports having developed a new architecture to perform an operation like, $AB^\wedge+C$, in a finite field. Such architecture internally represents the elements as powers of the primitive element. The proposed architecture supposedly has a low latency, compared to the other architectures. However, because of the exponential dependence of the hardware complexity on m in $GF(2^m)$, it is hardware efficient only for small finite Galois fields.

For larger finite fields, the University of Minnesota developed a parallel-in-parallel-out, bit-level pipelined multiplier architecture. Such architecture is said to reduce the overall area and decreases the system latency, as compared to the other proposed architectures. Utilizing the same approach, the University of Minnesota also developed a new parallel-in-parallel-out, bit-level pipelined architecture which performs squaring operations in finite field. The squarer is said to be 25% more hardware efficient than using a dedicated multiplier, and also has a lower system latency. The multiplier and squarer can be used in the square and multiply algorithm for exponentiation and yield an architecture with a claimed 12.5% hardware savings over the more current design and also have a lower system latency. The proposed architecture is easily implementable in VLSI because of its regular interconnection pattern, modular structures and concurrent operations. On the Internet, the University of Minnesota suggested for further reading on this subject, Surendra K. Jain and Kesha K. Parhi, "A Low Latency Standard Basis GF(2^M) Multiplier", 1995 International Conference on Acoustics, Speech, and Signal Processing, (Detroit, Mich.), May 1995; and. Surendra K. Jain and Kesha K. Parhi, "Efficient Power Based Galois Field Arithmetic Architectures", 1994 Workshop on VLSI Signal Processing, November 1994.

High levels of recording system performance and data reliability are now being attained by using a balanced combination of modulation coding and error-correcting coding (ECC). Coded modulation combines the functions of modulation and coding for a significant "coding gain" over conventional systems, which in some cases can exceed six decibels. The design engineer can then use this gain to increase areal density, increase transfer rate, or optimize performance in a number of other economically advantageous ways. The Reed-Solomon codes form the single most important class of error-correcting codes for use in data recording systems. Reed-Solomon codes efficiently correct random errors, long burst errors, multiple short bursts, and combinations of bursts and random errors.

Because disk drive areal densities have been increasing, the Quantum Corporation (Milpitas, Calif.) EUROPA 540/810/1080 AT hard disk drive series implements 160-bit Reed-Solomon single, double and triple burst Reed-Solomon error correction techniques to reduce the uncorrectable read error rate to less than one bit in every $10_{14}$ bits read. Single burst errors up to twenty-four bits per sector, and double burst errors up to forty-eight bits per sector are corrected on-the-fly, to improve data integrity and lessen any impact on the disk drive's performance. Because errors corrected on-the-fly do not require the drive to re-read the sector during the next revolution of the disk, such ECC correction is transparent to the host system. When errors cannot be corrected on-the-fly, an automatic retry and a more rigorous triple burst correction algorithm is used. Such measures can correct sectors with three bursts of up to twenty-four incorrect bits each, or up to nine multiple random one-byte burst errors. The Quantum EUROPA AT drives double check the main ECC correction with a cross-check code and algorithm to reduce the probability of primary ECC system miscorrection. Each sector in the Quantum EUROPA AT hard disk drive has 512 bytes of user data followed by two cross-check (XC) bytes, followed by eighteen ECC check bytes. The two cross-check bytes are used to double check the main ECC correction. As is conventional, the eighteen ECC check bytes are used to detect and correct errors, and the cross-check and ECC data are computed and appended to the user data when the sector is first written.

SUMMARY OF THE PRESENT INVENTION

An object of the present invention is to provide a highly integrated digital disk drive controller that integrates an advanced RISC-processor micro-controller, a host interface, a memory access controller, a disk-drive servo-control interface, a headerless ID-free formatter interface, a Reed-Solomon triple on-the-fly ECC, a serial interface, and a UART for self-test.

Another object of the present invention is to provide a hardware core for Reed-Solomon triple on-the-fly error detection and correction of sector read data in a hard disk drive.

A further object of the present invention is to provide a Reed-Solomon error correcting code (ECC) engine to detect and correct triple burst errors on-the-fly within sector read times and without host processor intervention.

It is another object of the present invention to provide an on-the-fly Reed-Solomon error detecting and correcting hardware core that is portable between system-on-a-chip designs and that is inexpensive to manufacture.

Briefly, an on-the-fly error detection and correction hardware core embodiment of the present invention for a mass storage hard disk drive comprises a microcode machine optimized and limited to doing Galois Field arithmetic (GF[$2^8$]) in support of Reed-Solomon error detection and correction (RS-EDC). The microcode machine is implemented as a hardware core in a system-on-a-chip design that includes a general purpose core RISC-processor. A dual-input arithmetic logic unit (ALU) includes a set of basic arithmetic blocks necessary to support the RS-EDC operations, e.g., a multiplier, a dedicated adder, a general purpose adder, a divider, a log unit, a quadratic solution lookup, a cubic solution lookup, and a move datapath. The operations and outputs of all the basic arithmetic blocks are presented in parallel to an op-code selector. The selected output is routed back for deposit to one of eight general purpose registers (R0–R7). A set of up to eight syndrome registers (S0–S7) can be selectively routed along with R0–R7 through a pair of ALU-input selectors. A microinstruction register allows a destination register decoder to be controlled, instruction-by-instruction, as well as the ALU input and output selectors. The microcode program is stored in a ROM-type structure that is indexed by a program counter. A flow control selector allows either the next microprogram address (+1) to be selected from an incrementer, or a branch address to be selected from a jump table.

An advantage of the present invention is that a hardware core is provided for on-the-fly error detection and correction in hard disk drive applications.

A further advantage of the present invention is that on-the-fly error detection and correction is provided that is simply and easily tuned or changed by program changes to a microcode program stored in ROM.

These and many other objects and advantages of the present invention will no doubt become obvious to those of ordinary skill in the art after having read the following detailed description of the preferred embodiments which are illustrated in the drawing figures.

IN THE DRAWINGS

DETAILED DESCRIPTION OF THE PREFERRED EMBODIMENTS

Figure 1:
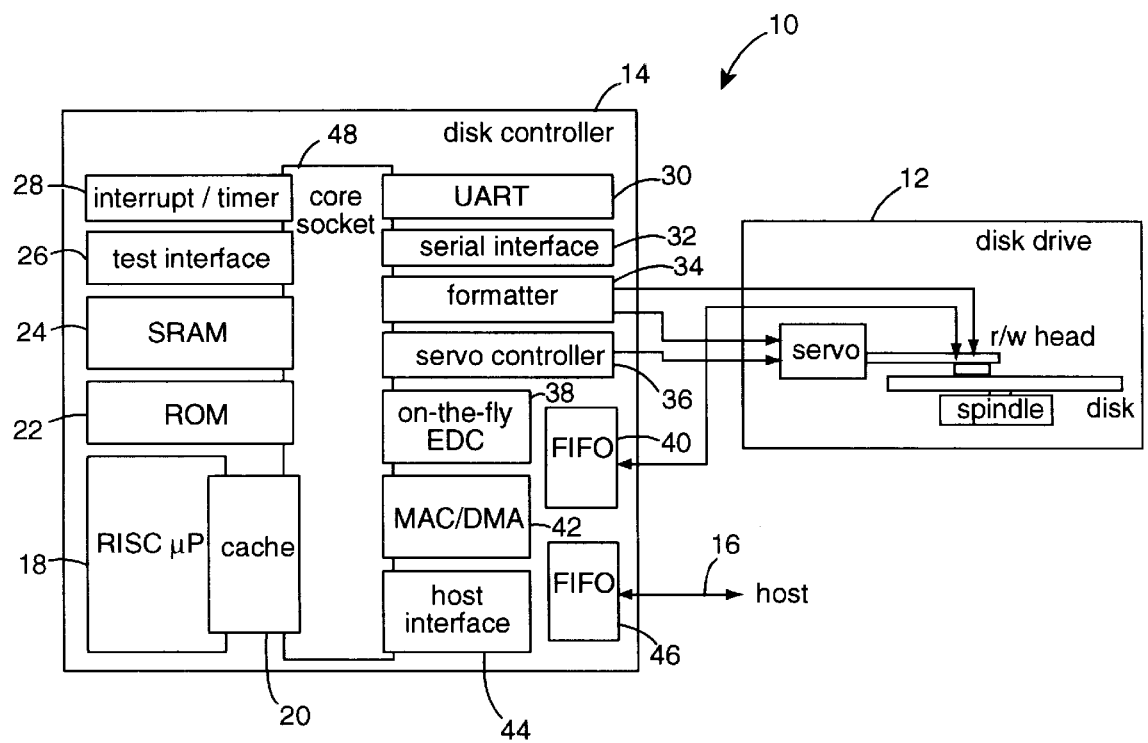
FIG. 1 is a functional block diagram of a storage system embodiment of the present invention.

FIG. 1 illustrates a storage system embodiment of the present invention, referred to herein by the general reference numeral 10. The system 10 comprises a disk drive 12 and a disk drive controller 14 with a host connection 16. The disk drive controller 14 integrates a reduced instruction set computer (RISC) micro controller 18, a cache memory 20, a read only memory (ROM) 22, a static random access memory (SRAM) 24, a test interface 26, an interrupt/timer 28, a universal asynchronous receiver transmitter (UJART) 30, a serial interface 32, a disk formatter 34, a disk servo controller 36, an on-the-fly error detection and correction (EDC) device 38, a first-in-first-out (FIFO) shift register 40, a memory access controller (MAC) and direct memory access (DMA) controller 42, a host interface 44, and a first-in-first-out (FIFO) shift register 46. All of which are preferably integrated onto a single integrated circuit using hardware core technology such as is available from Palmchip Corporation (San Jose, Calif.) under the trademarks COREFRAME and PALMSOCKET. The power dissipation is preferably less than 0.7 watts when clocked at 66 MHz and operated at 3 V. A core socket 48 interconnects all the functional hardware cores so integrated and preferably supports a 240 MB/s internal bus bandwidth.

The host interface 44 supports an industry standard Ultra-ATA-33 megabyte system interface. The serial interface 32 and UART 30 provide for self-test operations, debug, and system monitoring.

The vast majority of desktop systems shipping today rely on the ATA/IDE hard disk drive interface for moving data between the disk drive buffer and system memory. This dominance is not likely to change in the near future. The "Fast ATA" interface supports a burst data transfer rate of 16.7 megabytes per second (MB/s). To avoid bottlenecks during sequential transfers it became necessary to greatly increase this transfer rate to keep up with internal data rate improvements. Ultra ATA improves timing margins by eliminating propagation and data turnaround delays. During a read under Fast ATA, the drive must wait for the strobe from the host (propagation delay) before taking some time to respond by putting data on the bus (data turnaround delay), for which the host must then wait (more propagation delay). All these events must occur with a fixed time window between the falling edge of the strobe and the rising edge, when data is latched in the host. The Ultra ATA protocol eliminates these delays by having the drive be the source of both the strobe and the data during a read. Since the strobe and data signal travel in the same direction down the cable simultaneously, propagation delay in the opposite direction is eliminated. And since the drive controls both strobe and data, there is no data turnaround delay. With the time window remaining constant, less delay means improved timing margins during reads. On top of improved timing margins, the protocol of Ultra ATA also implements a significant feature new to ATA called cyclical redundancy check (CRC) to provide data protection verification. CRC is calculated on a per-burst basis by both the host and the drive, and is stored in their respective CRC registers. At the termination of each burst, the host sends the contents of its CRC register to the drive, which compares it against its own register's contents. For even greater integrity, the protocol can be used at speeds slower than its maximum 33 MB/s. In these cases, signal and data integrity will still surpass that of Fast ATA and earlier protocols at a given burst transfer rate. In fact, the slower the Ultra ATA transfer speeds, the greater the integrity margins.

The RISC micro controller 18 is preferably an Advanced RISC Machines (ARM) (San Jose, Calif.) ARM7TDMI core, which is a small, high-performance, low-power 32-bit RISC processor with THUMB code compression extension, an embedded in-chip debug system and a digital signal processor (DSP) capable multiplier. The ARM7TDMI fixed point math performance benefits from a combination of high speed arithmetic operations, enhanced multiply, and a barrel shifter. THUMB is a simple technique that provides a second "really reduced" instruction set to a THUMB-aware core. The THUMB extension provides 32-bit RISC system performance at 16-bit RISC system costs by the efficient use of a second, compressed set of instructions that reduce memory use by one third. The MAC/DMA controller 42 and host interface 44 preferably provide a high speed interface for EDO and synchronous DRAM interface to the host.

The disk drive controller 14 is preferably implemented as a fully-integrated disk controller core, i.e., a system on a chip.

Figure 2:
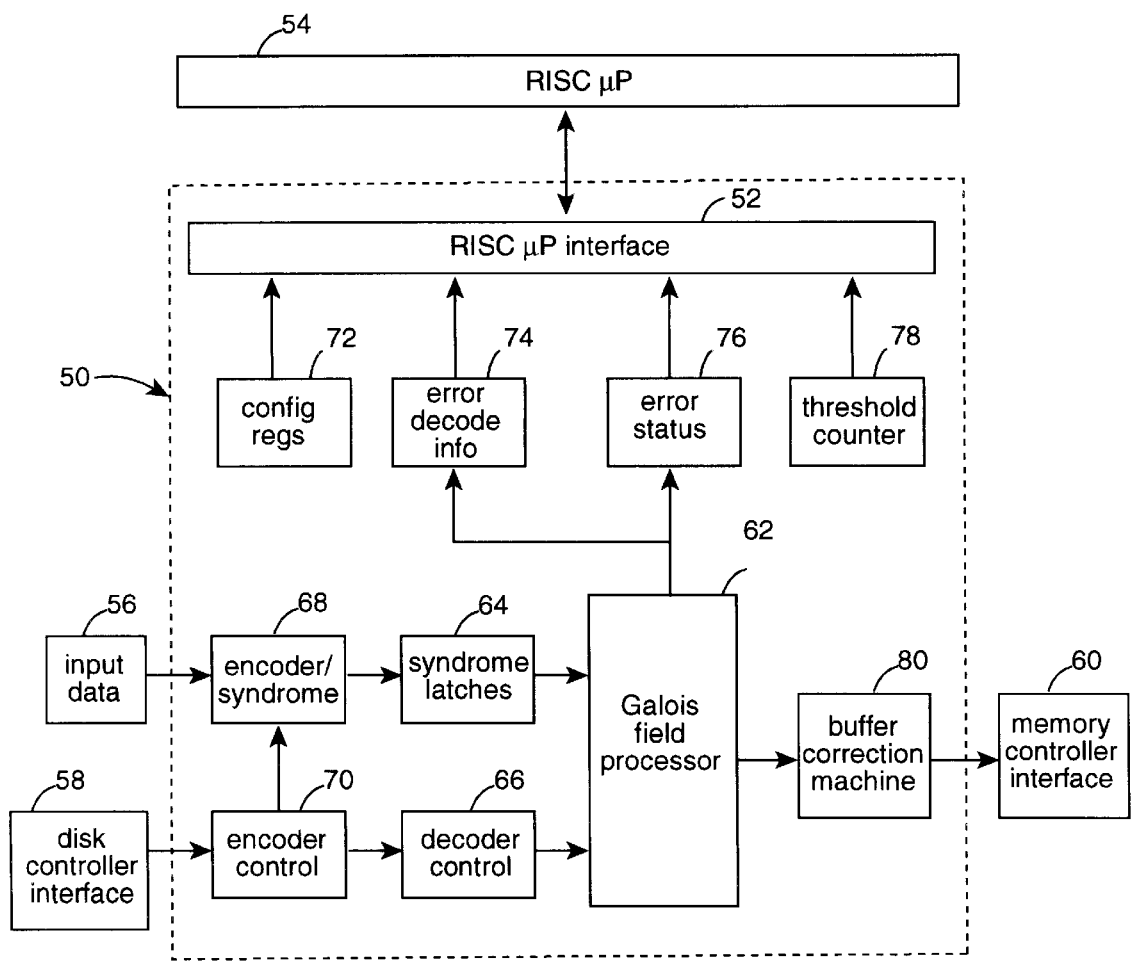
FIG. 2 is a functional block diagram of an error detection and correction hardware core embodiment of the present invention suitable for use in the system of FIG. 1.

In FIG. 2, an error detecting and correcting (EDC) core embodiment of the present invention is referred to by the general reference numeral 50. The EDC core 50 has a RISC microprogram processor intra-chip interface 52 for connection to a RISC microprogram processor core 54, e.g., an ARM7TDMI. The EDC core has connections to an input data 56, a disk controller interface 58, and a memory controller interface 60. A Galois Field (GF) processor 62 receives error detection and correction syndromes from a set of syndrome latches 64 and EDC-decoder signals from a controller 66. An encoder and syndrome generator 68 is placed in front of the syndrome latches 64 and is controlled by an encoder controller 70. A set of configuration registers 72 allow various options to be selected in the RISC-microcode processor 54 and EDC core.

All error decoding and correction is done in the buffer channel, with no host firmware interaction being necessary. The GF processor 62 preferably makes the complete syndrome, error locator and error value decoding information available at the end of each sector's decoding via an error decode information register 74 and an error status register 76. ECC seeding is included by inserting four bytes of ECC seed data at the beginning of each sector. An error threshold logging counter 78 keeps track of how many sectors had errors that exceeded a writable threshold value. A buffer correction machine 80 allows the detected and correctable errors in the datastream to be corrected before being shipped out in a FIFO.

It is also advantageous to build special test logic into the decoder block and GF processor 62 to allow for increased observability and controllability by the RISC-microcode processor 54.

The EDC core 50 preferably implements a 224-bit Reed-Solomon single, double and triple error correction to reduce the uncorrectable read error rate to less than one bit in $1 \times 10_{14}$ bits read. Twenty-eight bytes of ECC data are used with four-way interleaving resulting in seven bytes of ECC per interleave. Burst correction is guaranteed to correct any eighty-nine consecutive bits in error per sector. Up to twelve random bytes can also be corrected on-the-fly, allowing a high degree of data integrity with no impact to the drive's performance.

Because on-the-fly corrected errors do not require the drive to re-read the sector upon the next revolution of the disk to apply ECC correction, they are invisible to the host system. An additional cross-check code and algorithm are used in the GF processor 62 to double check the main ECC correction with the seventh ECC byte in each interleave, and this greatly reduces the probability of miscorrection.

A sector comprises 512 bytes of user data, followed by twenty-eight ECC check bytes, where each seventh one is a cross-check byte. The cross-check bytes are used to double check the main ECC correction and reduce the probability of miscorrection. The cross-check and ECC data is computed and appended to the user's data when each sector is first written.

The ECC check byte values within a sector are each interleaved into one of four groups, where the first byte is in interleave-1, the second byte is in interleave-2, the third byte is in interleave-3, the fourth byte is in interleave-4, the fifth byte is in interleave-1, the sixth byte is in interleave-2, and so on.

Each time a sector of data is read, the data and ECC check bytes are sent through a syndrome generator which checks the correctness of the data and check bytes. Any difference between the old and new check bytes is reflected in this set of syndromes. If there are no differences, all the syndrome values will equal zero, meaning the data was read with no errors. In such a case, the sector can be simply transferred to the host system. If any of the syndromes do not equal zero, this signals that a user data access error has occurred. The type of correction that needs to then be applied depends on the nature and the extent of the error(s).

In disk drives without on-the-fly correction, ECC correction of a single burst error will usually take about sixteen milliseconds, e.g., the amount of time it takes for the sector to rotate once around on the disk. The defective sector needs to be re-read and the data re-applied ECC mechanism, thus impacting overall system throughput rates.

Any single burst errors with up to four bad bytes (thirty-two bits) within a sector can be corrected. Correctable double burst errors must have two or fewer erroneous bytes per interleave. This allows the drive's Reed-Solomon ECC to correct double burst errors up to sixty-four bits long on-the-fly. Triple burst errors can be viewed simply as three spans of errors within one sector. More specifically, correctable triple burst errors must have three or fewer erroneous bytes per interleave. This allows the Reed-Solomon ECC to correct triple burst errors up to ninety-six bits long. When the triple burst error correction is successful, the data from the bad sector is preferably written to a spare sector, and the logical address will be mapped to the new physical location.

If an error is correctable on-the-fly, the error is corrected and the data is transferred to the host system via the host interface 44 (FIG. 1). If the data is not correctable on-the-fly, one or more of a suite of error recovery options selected in the configuration block 72 (FIG. 2) can be invoked.

Figure 3:
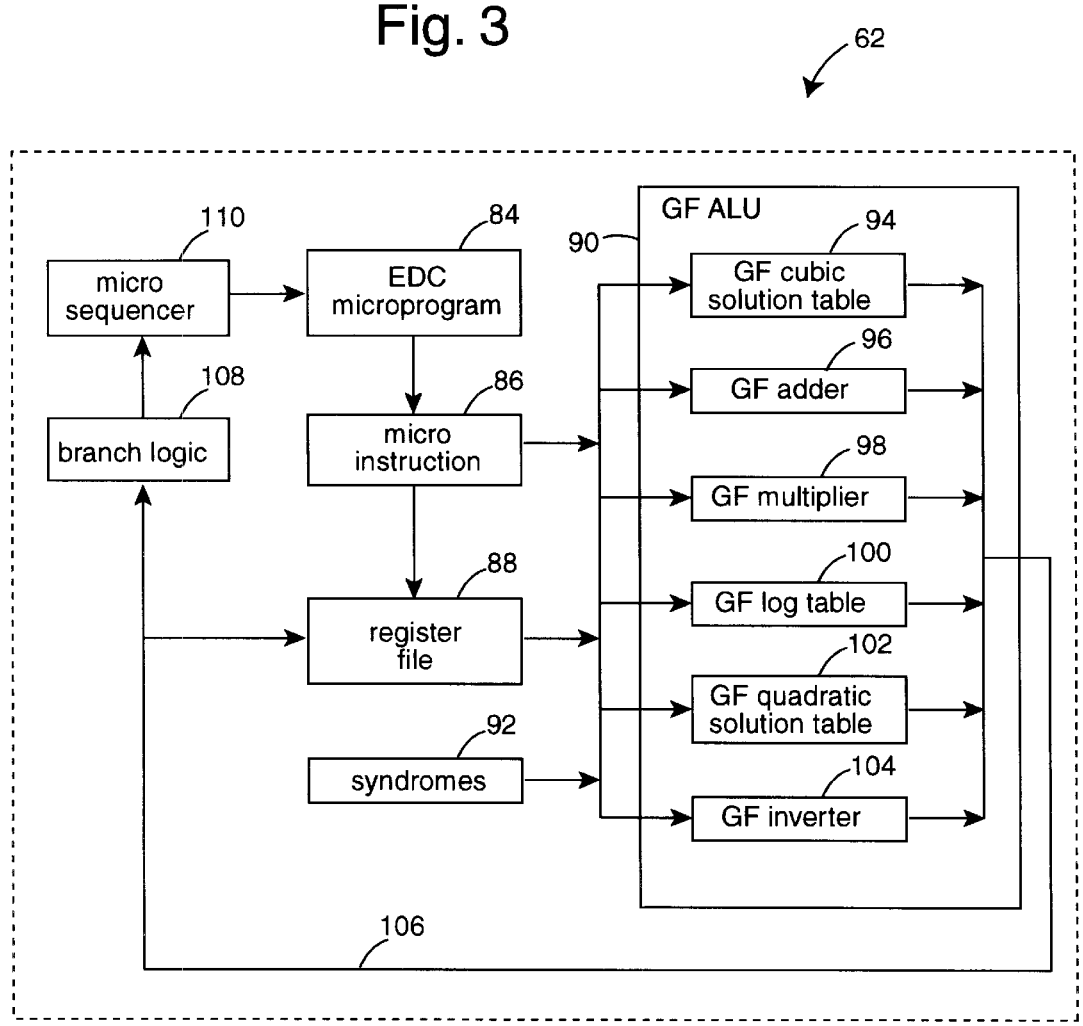
FIG. 3 is a functional block diagram of a Galois Field processor embodiment of the present invention suitable for use in the system of FIG. 1 and core of FIG. 2.

FIG. 3 is a functional block diagram of the Galois Field (GF) processor 62 of FIG. 2. The GF processor 62 includes an error detection and correction (EDC) algorithm in the form of a microprogram 84 that is stored in a read only memory (ROM) structure. Revisions and changes in the EDC algorithm are made to the microprogram 84 and preferably do not cause changes to be made in any of the other hardware or the system configuration. In prior art EDC implementations, microprograms are not used and the EDC algorithms are implemented purely in software. The computer-implemented EDC algorithm is loaded step-by-step from the microprogram 84 into the microinstruction register 86. One field of each instruction controls a register file 88 and another field controls a Galois Field arithmetic logic unit (GF-ALU) 90. Syndromes generated from reading disk sectors are provided from a block 92 to the GF-ALU 90. A lookup table 94 is provided as a quick operating cubic solution function. The GF-ALU further includes an adder 96, a multiplier 98, a log lookup table 100, a quadratic solution lookup table 102, and an inverter 104. An output 106 is fed back to load a selected destination register file 88 and to affect a branch logic 108. A micro-sequencer 110 is, in effect, a program counter and directs the next instruction to be executed. The GF processor 62 is preferably implemented in a pipelined configuration that allows an instruction to be fetched and decoded while the previous instruction is being executed and results stored.

Figure 4:
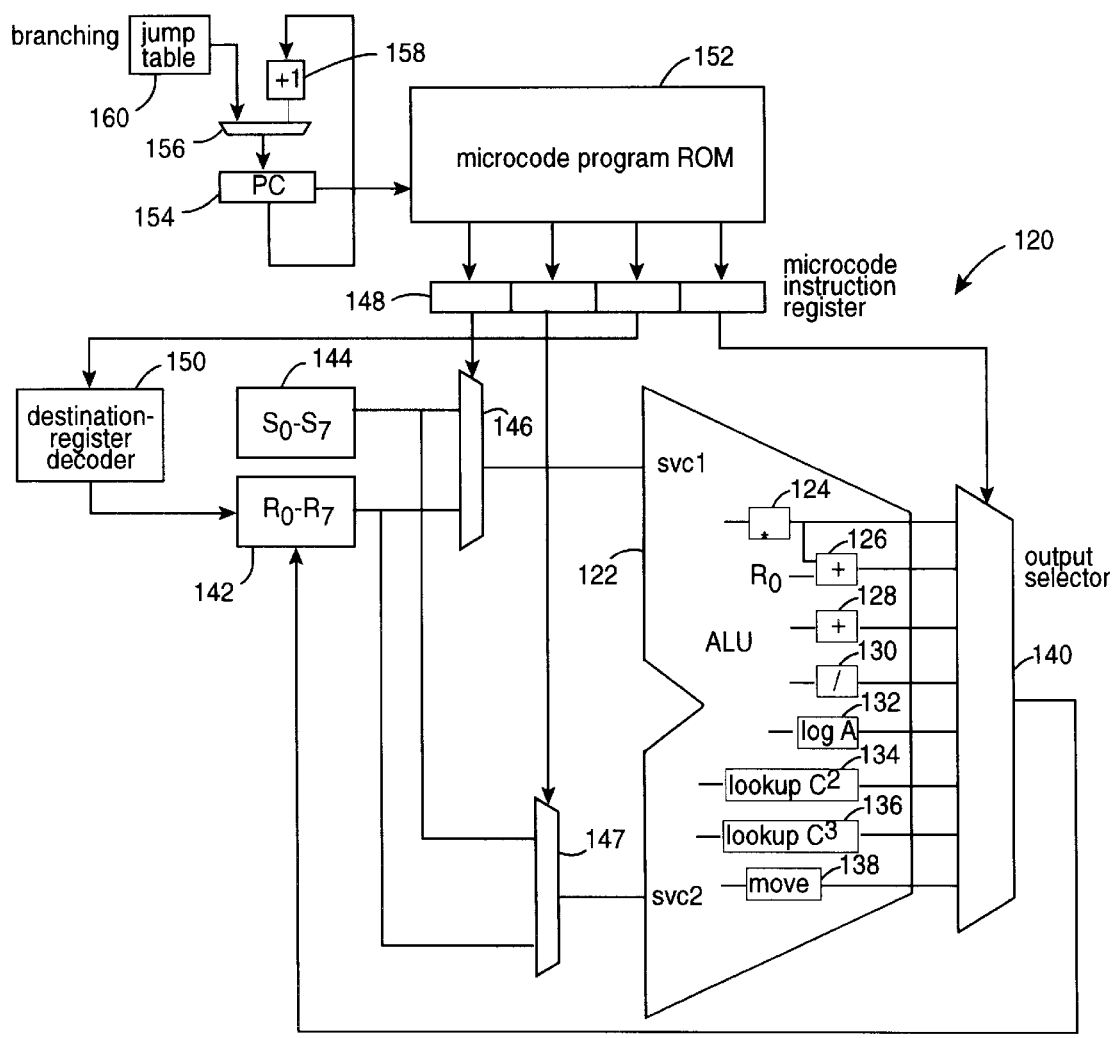
FIG. 4 is an abbreviated schematic diagram of one way to implement the Galois Field processor of FIG. 3 using microcode instructions and an arithmetic logic unit.

One way to implement the GF processor 62 of FIGS. 2 and 3 is illustrated in FIG. 4. A microcode machine 120 is optimized and limited to doing Galois Field arithmetic (GF[$2^8$]) in support of Reed-Solomon error detection and correction (RS-EDC) in computer memory storage disk drives. The microcode machine 120 is implemented as a hardware core in a system-on-a-chip design that includes a general purpose core RISC-processor. A dual-input, arithmetic logic unit (ALU) 122 includes a set of basic arithmetic blocks necessary to support the RS-EDC operations, e.g., a multiplier 124, a dedicated adder 126, a general purpose adder 128, a divider 130, a log unit 132, a quadratic solution lookup 134, a cubic solution lookup 136, and a move datapath 138. The operations and outputs of all the basic arithmetic blocks are presented in parallel to a selector 140. The selected output is routed back for deposit to one of eight general purpose registers (R0–R7) 142. A set of up to eight syndrome registers (S0–S7) 144 can be selectively routed along with R0–R7 142 through a pair of selectors 146 and 147 to the inputs of the ALU 122. A microinstruction register 148 allows a destination register decoder 150 to be controlled, instruction-by-instruction, as well as the selectors 140, 146, and 147. The microcode program is stored in a ROM 152 that is indexed by a program counter 154. A selector 156 allows either the next microprogram address (+1) to be selected from an incrementer 158, or a branch address to be selected from a jump table 160.

For example, the micro-instructions can be implemented as follows:

```
ADD:        0001
MULT:       0010
MULT/ADD:   0011  (multiply then add)
```

| op-code | destination | source1 | source2 |

```
MOVE:              0000
INVERT:            0100
LOG:               0101
QUADRATIC
SOLUTION:          0110
```

```
CUBIC
SOLUTION:   0111
```

| op-code | destination | source1 | jump table |

```
MOVEIMM:    1000  (move immediate)
```

| op-code | destination | immediate | |

```
TST/BRANCH: 1001  (test, branch conditional)
```

| op-code | conditionals | | jump table |

```
UPDATE: 1010
```

| op-code | | no. of errors | jump table |

```
NOP: 1111  (no operation)
```

| op-code | | | |

```
JUMP: 1011  (uncoditional)
```

| op-code | | | jump table |

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. An on-the-fly error detection and correction hardware core for a mass storage hard disk drive, comprises:

a microcode machine optimized and limited to doing Galois Field arithmetic (GF[$2^8$]) in support of Reed-Solomon error detection and correction (RS-EDC) and implemented as a hardware core in a system-on-a-chip design that includes a general purpose core RISC-processor.

2. The core of claim 1, wherein:

the microcode machine further includes a dual-input arithmetic logic unit (ALU) which includes a set of basic arithmetic blocks necessary to support said RS-EDC operations.

3. The core of claim 2, wherein:

the microcode machine arithmetic logic unit (ALU) includes a multiplier, a dedicated adder, a general purpose adder, a divider, a log unit, a quadratic solution lookup, a cubic solution lookup, and a move datapath, all of which operate in parallel and simultaneously supply the results of their operations to a selector controlled by a microprogram register.

4. The core of claim 1, wherein:

the microcode machine is part of an EDC core which is connected between a hard disk drive and a host computer which supports a transfer and correction of user data with data error detection and correction operating within a sector access time period; and the EDC core further includes logic which on data reads generates syndrome information that checks the validity of the data and check bytes.

wherein, if all said syndrome values equal zero, meaning said user data was read with no errors, said sector of data is simply transferred to the host system.

5. A storage system, comprising on a single integrated circuit:
   a disk drive interface and a disk drive controller with a host connection;
   wherein the disk drive controller integrates a reduced instruction set computer (RISC) micro controller, a cache memory, a read only memory (ROM), a static random access memory (SRAM), a test interface, an interrupt/timer, a universal asynchronous receiver transmitter (UART), a serial interface, a disk formatter, a disk servo controller, an on-the-fly error detection and correction (EDC) device, a first-in-first-out (FIFO) shift register, a memory access controller (MAC) and direct memory access (DMA) controller, a host interface, and a first-in-first-out (FIFO) shift register, and provides for an on-the-fly error detection and correction for a mass storage hard disk drive connected to the disk drive interface and said RISC micro controller comprises a microcode machine optimized and limited to doing Galois Field arithmetic ($GF[2^8]$) in support of Reed-Solomon error detection and correction (RS-EDC).

* * * * *